MODULE INSERTION MACHINE

Filed Aug. 23, 1966

INVENTORS
DANIEL W. ACKERMAN
ROBERT H. HOLMES

BY Fidelman & Wolffe

ATTORNEY

INVENTORS
DANIEL W. ACKERMAN
ROBERT H. HOLMES
BY Fidelman & Wolffe
ATTORNEY

INVENTORS
DANIEL W. ACKERMAN
ROBERT H. HOLMES
BY Fidelman & Wolffe
ATTORNEY

MODULE INSERTION MACHINE

INVENTORS
DANIEL W. ACKERMAN
ROBERT H. HOLMES

BY Fidelman & Wolffe
ATTORNEY

INVENTORS
DANIEL W. ACKERMAN
ROBERT H. HOLMES

BY Fidelman & Wolffe

ATTORNEY

United States Patent Office 3,442,430

Patented May 6, 1969

3,442,430

MODULE INSERTION MACHINE

Daniel W. Ackerman, Binghamton, and Robert H. Holmes, Marathon, N.Y., assignors to Universal Instruments Corporation, Binghamton, N.Y., a corporation of New York Filed Aug. 23, 1966, Ser. No. 574,394
Int. Cl. B21j *15/28;* B25c *5/04, 5/08*
U.S. Cl. 227—2 19 Claims

ABSTRACT OF THE DISCLOSURE

An apparatus for inserting into a board leads of electrical components characterized by a component body portion having a plurality of generally L-shaped leads, said leads being arranged in two rows and extending one row from each of a pair of opposed side surfaces of said body portion, the free ends of said leads of each said row projecting outwardly beyond one body portion surface joining said side surfaces, which comprises a component inserter adapted to be reciprocated from a first position into a component insertion position; means adapted to position one component at a time in alignment with the path of reciprocation of the insertion means when in the first position thereof and to effect relatively outward straightening of the rows of leads with respect to the opposed side surfaces of the component body portion prior to engagement of the component by the insertion means; and means operable to relatively inwardly straighten and align the relatively outwardly straightened leads prior to the insertion of the component leads into a board.

The present invention relates to an apparatus for inserting electrical components into a circuit board. More particularly, the present invention is directed towards an insertion apparatus which is primarily designed to handle electrical components, such as modules, which are characterized by a design in which a plurality of substantially L-shaped leads extend from opposite side surfaces of a component body portion.

Numerous machines including those diclosed in copending application Ser. No. 544,552, filed Apr. 22, 1966, and Patent 3,254,821, issued June 7, 1966, have heretofore been proposed for the purpose of inserting electrical components into a circuit board. Conventionally, such machines are provided with an insertion assembly including a component support, a reciprocal component inserter which is adapted to pick up a component from the component support and thereafter insert same in to a circuit board, and with a component feeding assembly adapted to transfer components one at a time onto the component support from a suitable supply of components.

Further, it has been proposed in Patent No. 3,254,821 to provide means to effect straightening of the leads of the components during the feeding thereof to the inserter, and in application Ser. No. 544,552 to provide a component support adapted to positively position a component supported thereon to insure accurate orientation of the component when picked up by the component inserter.

However, the apparatus of Patent No. 3,254,821 and Ser. No. 544,552 are not readily adapted for use in inserting modules characterized by a design in which a plurality of generally L-shaped leads extend from opposite side surfaces of a component body portion, nor do they include means to positively position modules with respect to the circuit board during transfer and insertion thereof by the inserter.

Accordingly it is an object of the present invention to provide an apparatus adapted to insert modules characterized by a design in which a plurality of generally L-shaped leads extend from opposite side surfaces of a component body portion.

It is a further object of the present invention to provide in an insertion apparatus an insertion assembly having means to positively position a component with respect to a circuit board during travel of the component to insertion position.

A further object is to provide an insertion apparatus having means operable during motion of a component inserter towards a component insertion position to align, straighten and guide the leads of the component.

A still further object is to provide an improved component feeding assembly adapted for use with the insertion assembly of the present invention.

These and other objects of the present invention will become apparent from the following description taken with the accompanying, drawings, in which.

Figures 1, 7A, 7B:
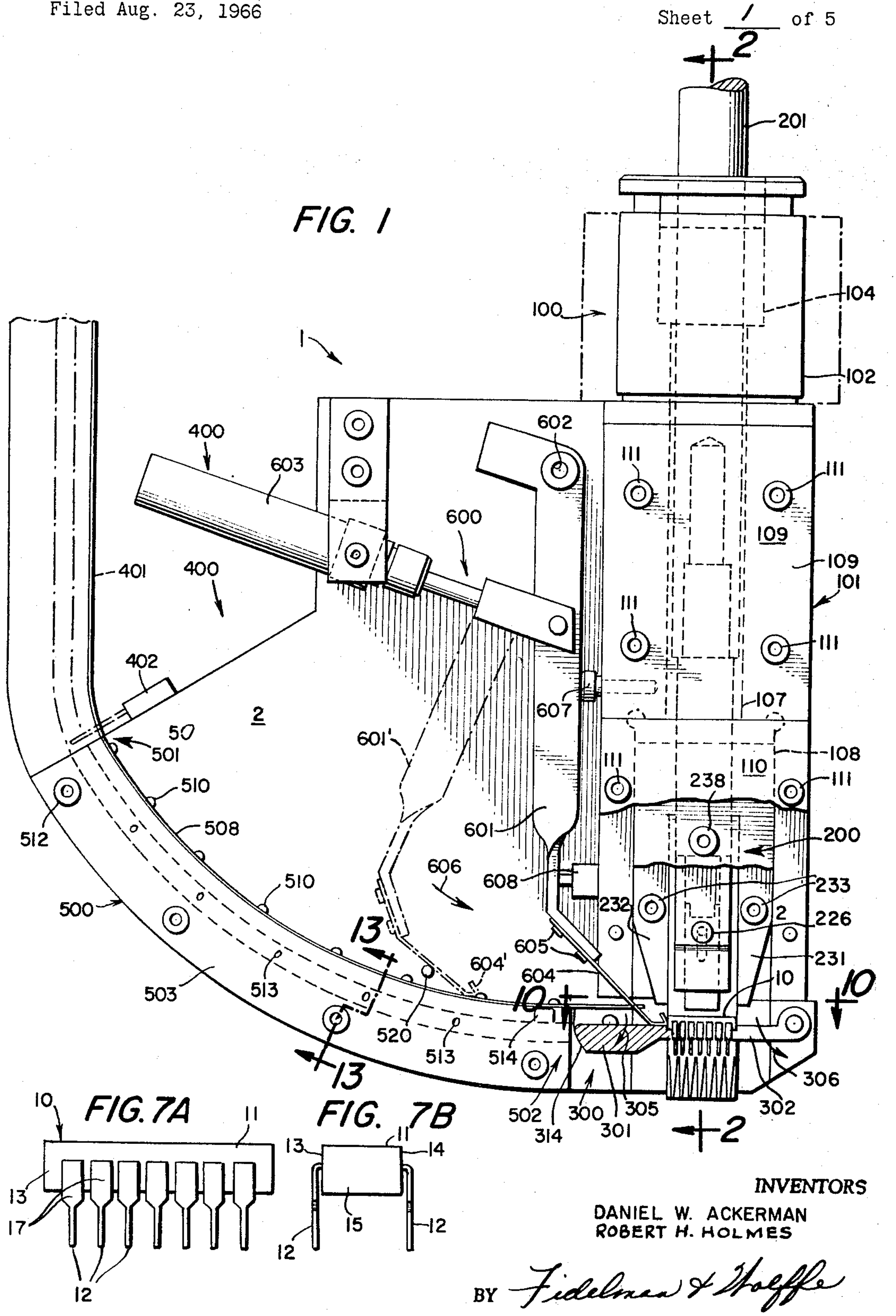
FIG. 1 is a front elevation view of the insertion apparatus of the present invention showing the relative positioning of the component feeding and insertion assembling.
Figures 2, 8:
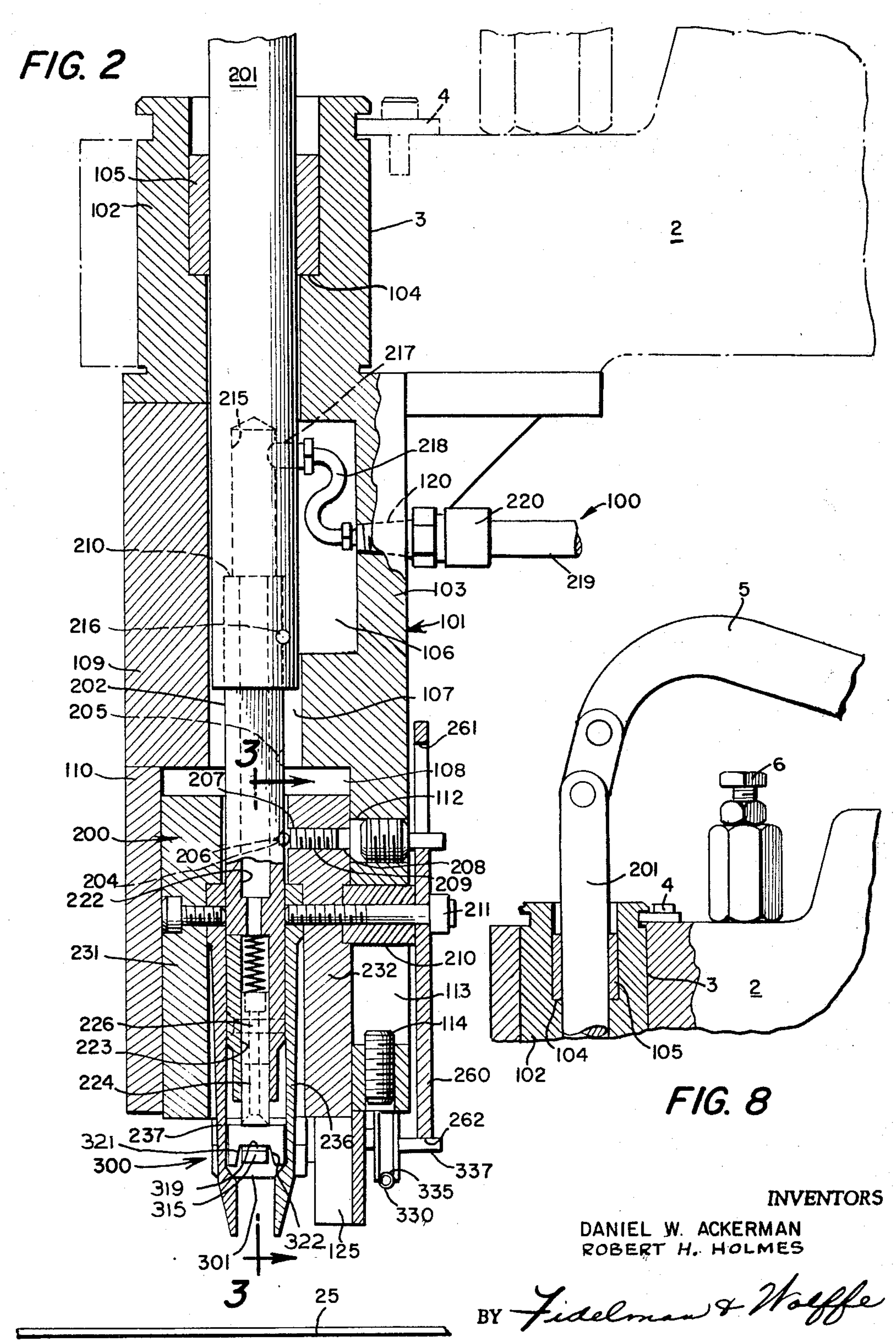
FIG. 2 is a sectional view taken generally along line 2—2 of FIG. 1.
Figure 4:
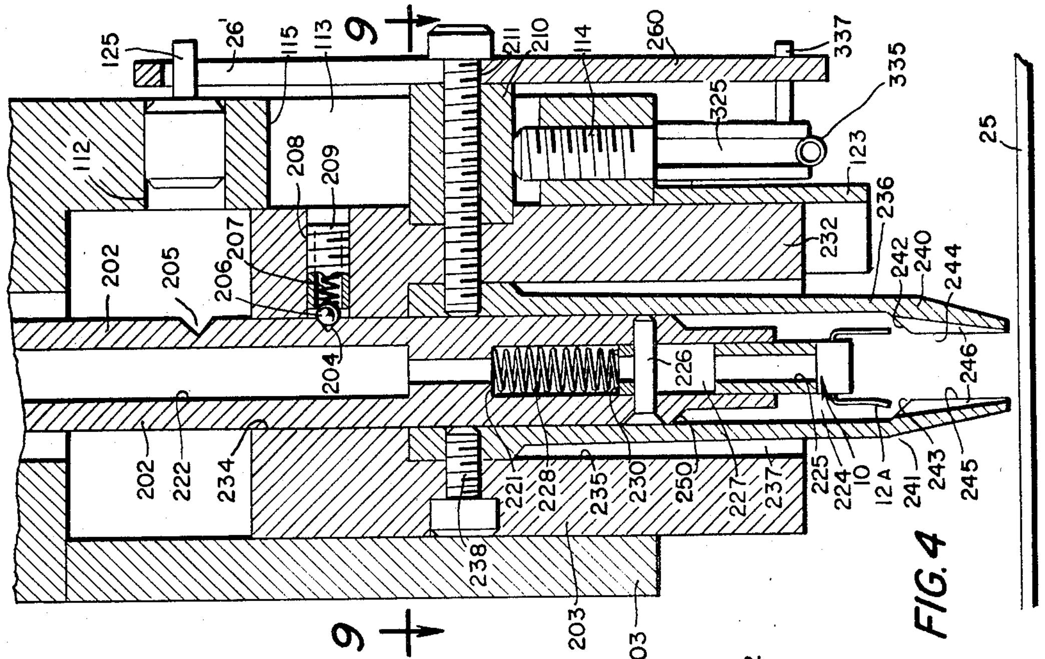
FIG. 4 is a sectional view similar to FIG. 2, but having portions removed and showing the component inserter moved to the partially down position illustrated in FIG. 3.
Figures 3, 12:
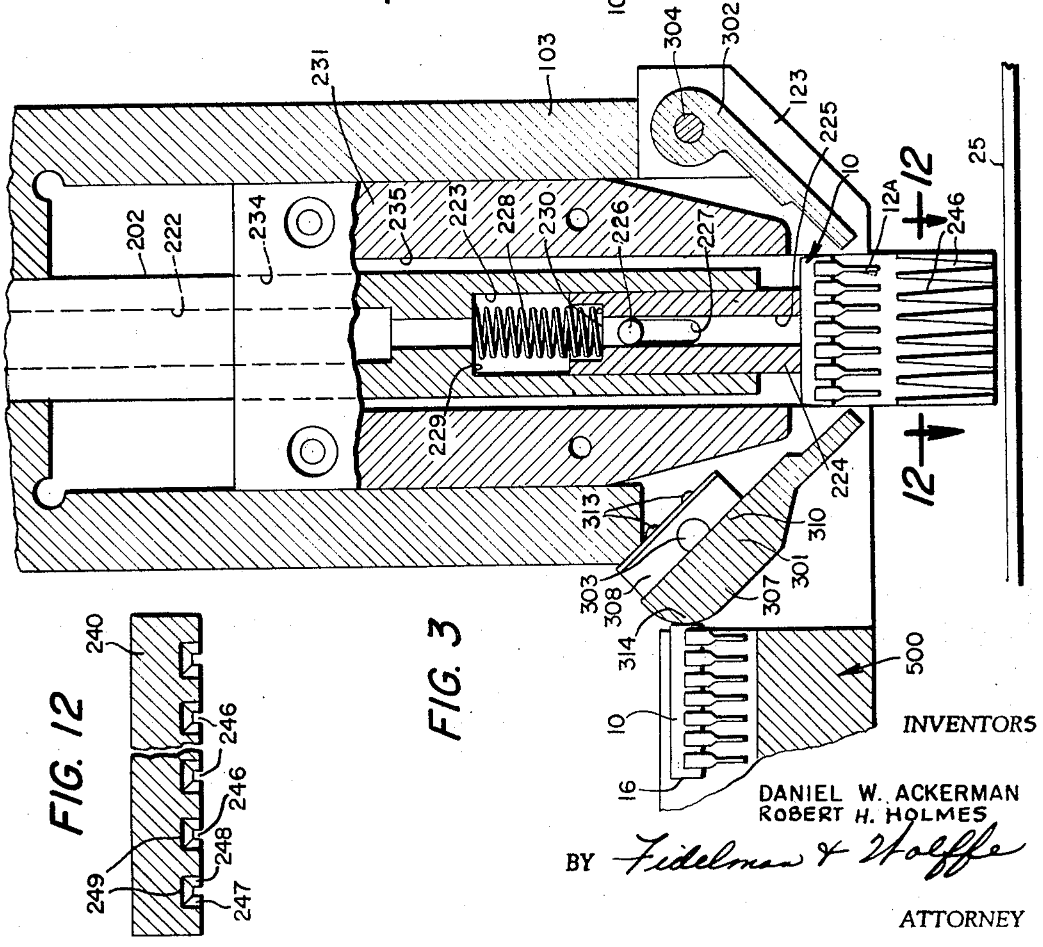
FIG. 3 is a sectional view taken generally along line 3—3 of FIG. 2, but showing the component inserter moved to a partially down position at which the component supports are fully removed from supporting position.
Figure 9:
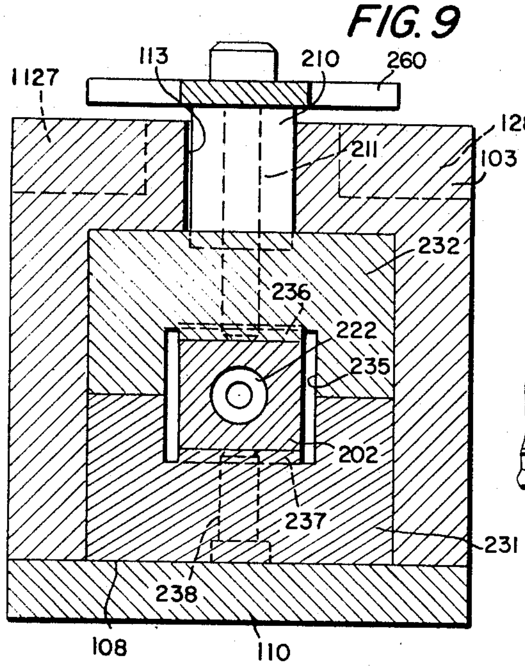
Figure 10:
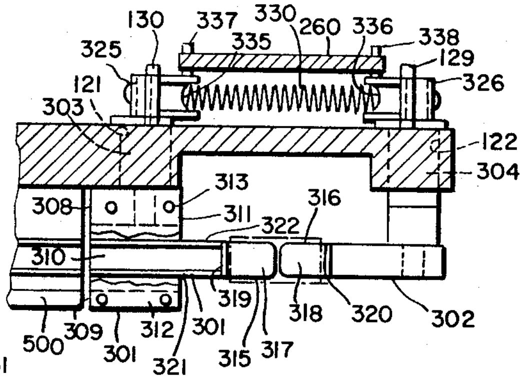
Figure 11:
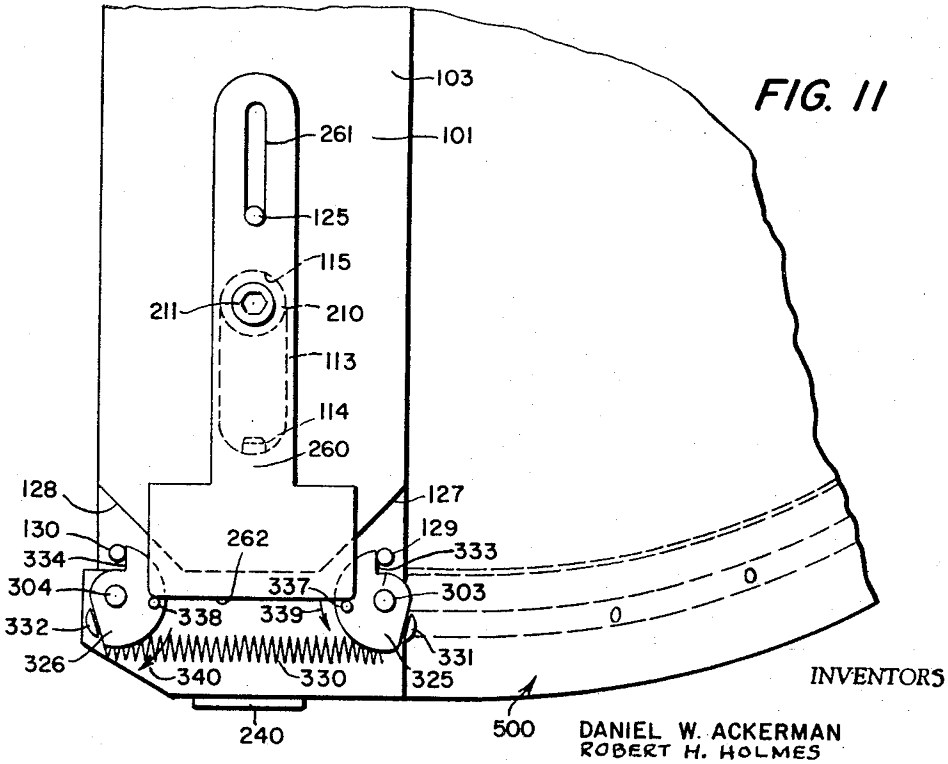

FIG. 7*a* and 7*b* are side and end elevational views, respectively, of a component for which the apparatus of the present invention is primarily designed;

FIG. 8 is a fragmentary view illustrating the structure of the upper end of the inserter actuating control rod and the motion adjustment therefore;

FIG. 9 is a sectional view taken generally along line 9—9 of FIG. 4;

FIG. 10 is a sectional view taken generally along line 10—10 of FIG. 1;

FIG. 11 is a fragmentary rear elevational view of the insertion assembly;

FIG. 12 is a sectional view taken generally along line 12—12 of FIG. 3; and

Figures 5, 6, 13:
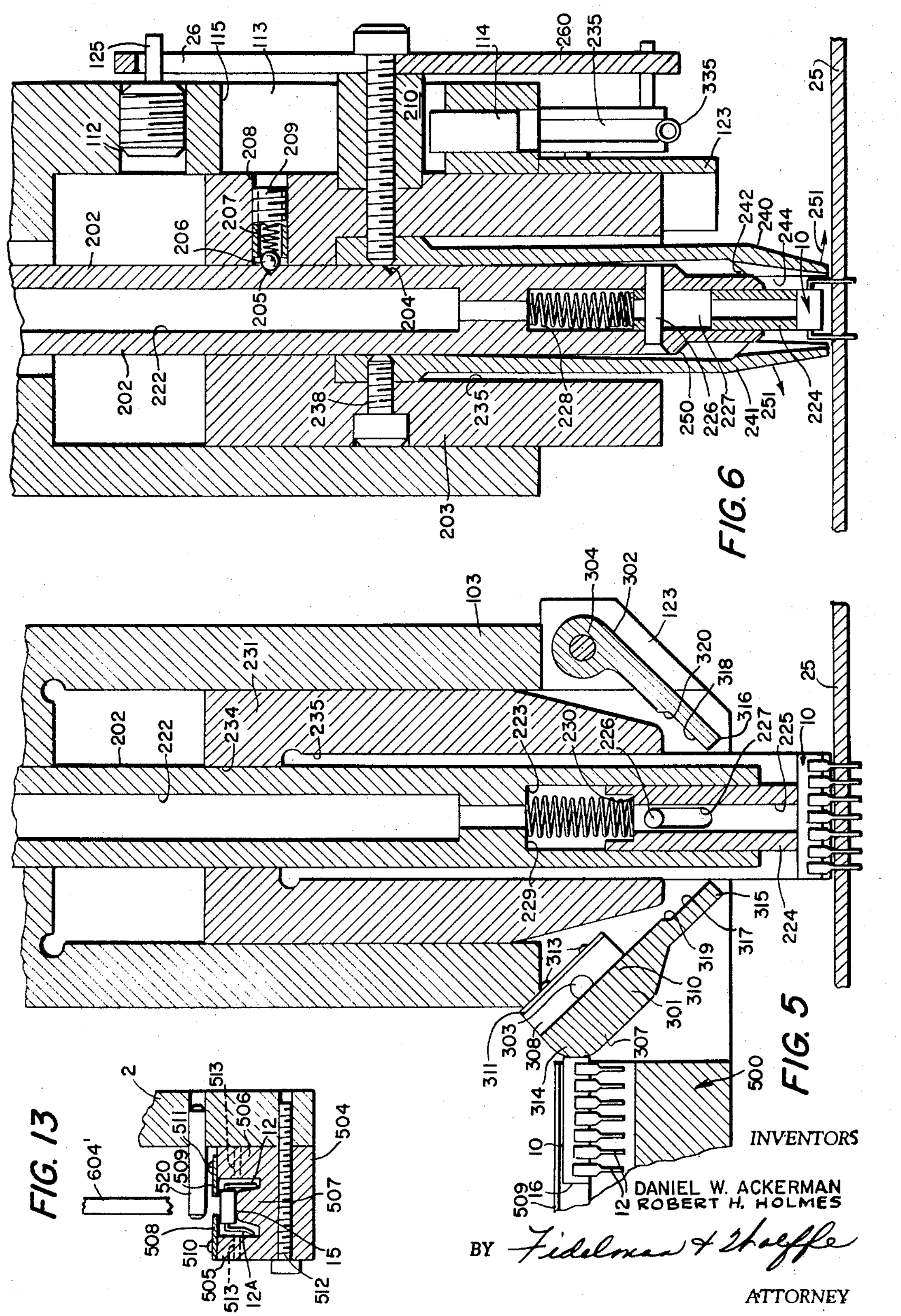
FIG. 5 is a view similar to FIG. 3, but showing the component inserter in component interted position.
FIG. 6 is a view similar to FIG. 4, but showing the component inserter in component inserted position.

FIG. 13 is a sectional view taken generally along line 13—13 of FIG. 1.

The component insertion apparatus of the present invention is generally designated as 1 in FIG. 1 and is shown as including a component insertion assembly, indicated as 100 and a component feeding assembly, indicated as 400, which are mounted in any suitable manner on an apparatus framework 2, only portions of which are shown in the figures.

The apparatus of the present invention is particularly adapted for use in inserting electrical components of the type generally designated as 10 in FIG. 5 into a suitable circuit board, generally designated as 25. Components 10 are characterized by a body portion 11 and a plurality of generally L-shaped leads 12 which extend from a pair of opposed side surfaces 13 and 14 of body portion 11. Normally leads 12 are of equal length and the free ends thereof project a substantial distance below body portion lower surface 15 which connects side surfaces 13 and 14. While components 10 are illustrated as having seven equally spaced leads extending from each of the side surfaces 13 and 14, it will be understood that the apparatus of the present invention may be employed to insert components having any desired number of leads of any desired relative spacing and that if desired the length of the respective leads may be varied.

The component insertion assembly 100 is shown in FIGS. 1 and 2 as including a housing 101; a component inserter, which is generally designated as 200 and adapted to be vertically reciprocated with respect to housing 101 by means of a suitably actuated control rod 201; and a component support, which is generally designated as 300 and adapted to support components 10 fed to the insertion assembly by the feed assembly 400 in position to permit the components to be picked-up one at a time by the component inserter 200 and thereafter be inserted into circuit board 25. Control rod 201 is operably connected to a fluid actuating, cylinder, not shown, by suitable means such as connecting linkage 5.

Housing 101 is shown in FIGS. 2 and 3 as being in the form of a cast metallic block having a cylindrical upper end portion 102 and a lower portion 103 of rectangular cross-sectional design. Upper end portion 102 is supported within framework bore opening 3 by any suitable means, such as a screw-disc lock 4, and provided with a stepped cylindrical bore opening 104 into which a control rod guide bearing 105 is force fitted. Lower housing portion 103 is shown as being provided with vertically extending joined openings 106, 107 and 108 of rectangular cross-sectional configuration, which are aligned with stepped bore opening 104. Preferably, openings 106, 107 and 108 are defined by vertically extending slots machined in housing portion 103 and a pair of block face plates 109 and 110, which are affixed to portion 103 by means of screws 111.

The component inserter 200 is shown primarily in FIGS. 1 through 6 and 9 as including a tube member, generally designated as 202, and head member, generally designated as 203. Referring particularly to FIGS. 2, 4 and 6, it will be seen that head member 203 is slidably mounted on tube member 202 for movement between upper and lower positions at which the members are resiliently connected for simultaneous movement together by means of tube member recesss 204 and 205, respectively, which are adapted to receive a ball detent 206 carried on head member 203. Ball detent 206 is biased towards tube member 202 by a compression spring 207, which is adjustably positioned within threaded head opening 208 by adjustment screw 209. Access to screw 209 is afforded when inserter 200 is in its upper position, illustrated in FIG. 2, through threaded opening 112 provided in housing block 102.

To facilitate understanding of the structure and mode of operation of inserter 200, it will be understood at the outset that during the initial portion of downward movement of control rod 201, the inserter is forced to move from the position illustrated in FIGS. 1 and 2 to that illustrated in FIGS. 3 and 4. During this portion of inserter movement tube member 202 and head member 203 move together with ball detent 206 received within recess 204. Further, a component is picked up by tube member 202 and the component support 300 is moved from its component supporting position illustrated in FIG. 1 to a retracted or component unblocking position illustrated primarily in FIG. 3. Upon reaching the position illustrated in FIGS. 3 and 4, a cylindrically shaped abutment 210, which is affixed to head member 203 by screw 211 and slidably received within vertically disposed housing block slot 113, engages a housing abutment in the form of a vertically adjustable screw 114 to prevent further downward movement of head member 203. Further downward movement of control rod 201 forces ball detent 206 out of recess 204 against the bias of spring 207 to permit the tube member 202 to slide downwardly with respect to head member 203 to the position illustrated in FIGS. 5 and 6 at which point leads 12 of component 10 are inserted into circuit board 25. During movement of tube member 202 between the positions illustrated in FIGS. 3, 4 and 5, 6, respectively, a component 10 carried thereby is positively positioned with respect to circuit board 25 and if necessary the component leads 12 straightened and aligned by hereinafter discussed means supported on head member 203.

The lower position of tube member 202 may be readily adjusted by means of an adjustable screw stop 6, which is carried on apparatus framework 2 and adapted to engage control rod connecting linkage 5 (see FIG. 8).

Upon upward movement of control rod 201, tube member 202 and head member 203 move together with ball detent 206 received within recess 205 until head member abutment 210 engages the upper end 115 of housing block slot 113. Further upward movement of control rod 201 forces ball detent 206 out of recess 205 against the bias of spring 207 to permit tube member 202 to slide upwardly to its initial or upper position illustrated in FIGS. 1 and 2 at which point ball detent 206 is again received within recess 204. Upward movement of head member 203 permits support 300 to be returned to its component supporting position.

Referring particularly to FIG. 2, it will be seen that tube member 202 is locked at its upper end within a stepped recess 215 provided adjacent the lower end of control rod 201, as by a pin 216. Rod stepped recess 215 is shown as having a laterally extending bore opening 217 adapted to receive the end of a flexible tube 218. Tube 218 is connected at its other end to a second tube 219 in communication with a source of vacuum, not shown, by means of fluid coupling 220 which is threadably received within opening 120 provided in housing part 103.

Tube member 202 is shown in FIGS. 2–6 as being provided with a vertically extending stepped bore opening 222, which is disposed in fluid communication at its upper end with control rod stepped recess 215. Bore opening 222 is enlarged as at 223 adjacent the lower end thereof to recive a component pick up head 224 having a vertically extending bore opening 225 disposed in fluid communication with tube bore opening 222. Pick up head 224 is supported for limited vertical sliding movement within bore enlargement 223 by a transversely disposed pin 226, which is carried on tube member 202 and adapted to be received within vertically extending slot 227 provided in pick up head 224. Pick up head 224 is normally biased downwardly with respect to tube member 202 by a coil spring 228 disposed within bore enlargement 223 between bore opening step 229 and the lower surface of transversely extending pick up head slot recess 230. It will be understood that during downward movement of inserter 200 from the position illustrated in FIG. 1, bore opening 225 of pick up head 224 is connected to a source of vacuum, not shown, through the passageway defined by tube bore 222, control rod recess 215 and tubes 218, 219, to permit the pick up head to pick up a component 10 from support 300 and thereafter insert the component into circuit board 25. Thereafter, during upward movement of inserter 200 pick up head 224 is disconnected from the vacuum source, by means not shown, to prevent unseating or withdrawal of the inserted component. It will be seen that spring 228 in addition to cushioning the contact between pick up head 224 and the component, permits pick up head to be partially retracted within tube enlarged bore 223 during component pick up insertion to compensate for variations in thickness of the components being processed by the apparatus.

The head member 203 is shown particularly in FIGS. 2, 3 and 9 as being mounted for vertical sliding movement with respect to housing opening 108 and as including a pair of blocks 231 and 232 which are affixed together by suitable means, such as screws 233, shown only in FIG. 1. Opposed mating surfaces of blocks 231 and 232 are machined to form vertically aligned stepped openings 234 and 235 of rectangular cross-sectional configuration. Preferably, the walls of upper head opening 234 slidably engage the side surfaces of tube member 202 to prevent lateral movement of the lower end of the tube member during movement of the pick up head 224 into the insertion position, illustrated in FIGS. 5 and 6.

Referring primarily to FIGS. 3, 4 and 9, it will be seen that a pair of parallel spring plates 236 and 237 are disposed within lower head opening 235 on opposite sides of tube member 202 and affixed to blocks 232 and 231 by screws 238 and 211, respectively. Spring plates 236, 237 are shown as having a component positioning lower end portions 240 and 241, which during the steps of component positioning and insertion, are disposed immediately adjacent the upper surface of circuit board 25. In FIGS. 3, 4 and 12, component positioning portions 240 and 241 are shown as being provided with downwardly and inwardly inclined cam follower surfaces 242, 243 and opposed flat front wall surfaces 244, 245, which are each provided with a plurality of spaced vertically extending slots or grooves 246. Slots 246 are tapered in the direction of inserter motion towards component insertion position illustrated in FIGS. 5 and 6, and are defined (see FIG. 12) by vertically inclined side walls 247, 248 and vertically inclined rear wall 249. The relative positioning and number of slots 246 provided is determined by the relative positioning and the maximum number of leads 12 of the components to be inserted by the apparatus.

From the foregoing it will be apparent that as tube member 202 is moved downwardly from the position illustrated in FIGS. 3 and 4 to that illustrated in FIGS. 5 and 6, the component leads 12 are forced to move downwardly within the relatively stationary tapered slots 246, whereby leads 12 and thus component 10 are progressively positioned with respect to circuit board 25. By providing positioning portions 240 and 241, misalignment of a component on support 300, due to component size variations or variations in the feeding of components onto the support, or misalignment of a component due to incorrect component pick up and transfer by tube member 202 may be corrected. Further, it will be apparent from viewing FIGS. 3 and 4 that the walls of slots 246 function to progressively straighten and align bent or deformed component leads, such as shown at 12A, as component 10 is transferred to insertion position. Positioning of the component positioning portions 240 and 241 immediately adjacent to circuit board 25 insures that the previously aligned free end of each component lead 12 passes directly into the board before having an opportunity to be deflected due to any straightening action of the remaining upper portions of the lead.

In moving to the component insertion position of the inserter, shown in FIGS. 5 and 6, it will be seen that tube member cam surfaces 250 slidably engage cam follower surfaces 242, 243 to force the component positioning portions 240 and 241 of the plates slightly apart as indicated by arrows 251. Accordingly, when the inserter 200 is subsequently moved upward the relatively small lower ends of the slots 246 are permitted to clear the enlarged upper lead portions 17 to prevent withdrawal of component 10 from inserted position.

The component support 300 is shown in FIGS. 1, 3, 5 and 10, as including a pair of support members 301 and 302, which are suitably affixed to shafts 303 and 304 journaled within bore openings 121 and 122, respectively, provided within lower housing extension bracket 123. As more fully hereinafter described, members 301 and 302 are adapted to be pivoted about the axis of shafts 303 and 304 in the directions indicated by arrows 305 and 306, respectively, from their component supporting position shown in FIG. 1 to a retracted position shown in FIGS. 3 and 5 by head member 203, as inserter 200 is reciprocated downwardly.

Support member 301 includes an intricately formed base portion 307, side portions 308 and 309, centrally disposed component supporting guide rib portion 310, and a pair of upper component guide plates 311 and 312. Plates 311, 312 are shown in FIG. 10 as being affixed to the upper surfaces of side portions 308 and 309, respectively, by means of screws 313. The above described structure of support member 301 corresponds in cross-sectional detail to that of the adjacently disposed portion of feeding assembly 400 to permit a component to be fed onto support 300 when in the position illustrated in FIG. 1. Also, it will be seen by referring to FIGS. 3 and 5 that the inlet end surface of support member 301, which is curved as at 314, forms a stop or abutment to prevent feeding of a component thereto when member 301 is pivoted from supporting position.

Support members 301 and 302 are provided with intricately formed extensions 315 and 316 having recessed component supporting upper surfaces 317 and 318 and inclined stop surfaces 319 and 320, respectively. The spacing between stop surfaces 319, 320 corresponds to the maximum lengthwise dimension of the components to be inserted. By viewing FIGS. 1 and 10, it will be apparent that when a component is fed onto component support 300 by feeding assembly 400 in the manner hereinafter described, the component is guided by rib portion 310 onto extensions 315 and 316 whereafter stop surfaces 319 and 320 maintain the component in pick up position in line with the path of reciprocation of pick up head 224. The side surfaces 321 and 322 of rib portion 310, which are shown in FIG. 10 as being inclined, may be employed to laterally spread apart component leads which have been inwardly deformed; such leads being thereafter straightened and aligned with respect to the remaining leads of the component, as discussed above.

The means for controlling movement of component support members 301, 302 to and from their supporting position is illustrated in FIGS. 2, 4, 6, 10 and 11. It includes an inverted T-shaped cam plate 260, which is affixed to head member 203 by screw 211, and a pair of cam follower members 325 and 326, which are suitably keyed for rotation with support member shafts 303 and 304, respectively.

Cam plate 260 is prevented from rotating about the axis of screw 211 during reciprocation thereof by means of a pin plug 125, which is slidably received within vertically extending plate slot 261. Pin plug 125 is threadably received within housing block opening 112.

In FIG. 11 housing block portion 103 is shown as being cut out, as at 127 and 128, to receive cam follower members 325, 326 and as being provided with limit stop pins 129 and 130. A coil spring 330 is connected, as by screws 331 and 332, to members 325 and 326, and employed to normally bias stop surfaces 333 and 334 of members 325, 326 towards limit stop pins 129, 130, respectively. Peripheral surface grooves 335 and 336, provided in members 325 and 326, respectively, are employed to receive and guide spring 330, as the members are rotated in the manner hereinafter discussed. Also, cam follower members 325 and 326 are provided with cam pins 337 and 338 which are normally biased into engagement with lower edge surface 262 of cam plate 260 by spring 330.

From the foregoing it will be understood that spring 330 tends to bias cam follower members 325, 326 into the position illustrated in FIG. 11 and component support members 301, 302 in their component supporting position illustrated in FIG. 1. Upon downward movement of the inserter 200, cam plate 260, which is connected to head member 203, is forced to move into the position illustrated in FIGS. 3 and 4, whereby cam pins 337, 338 are forced against the bias of spring 330 to describe a circle about the axis of shafts 303, 304 to pivot cam follower members 325, 326 in the directions indicated by arrows 339, 340 and thus remove members 301, 302 from component supporting position. Upon upward movement of cam plate 260, spring 330 forces cam pins 337, 338 to follow the cam plate and return component supporting members 301 and 302 to the position illustrated in FIG. 1.

Feeding assembly 400 is illustrated primarily in FIG. 1 as including a component supply, shown in phantom and generally indicated as 401; a component feed chute, generally indicated as 500; and component feeder mechanism, generally indicated as 600.

For purposes of the present invention, component supply 401, shown in phantom in FIG. 1, may be of any desired construction and may be either permanently affixed to apparatus framework 2 or be of the removable cartridge variety. It will be understood, however, that supply 401 is provided with a suitable escapement, indicated generally as 402, which is adapted to be actuated by the control system of the apparatus, not shown, once during each cycle of operation of component inserter 200 to discharge a single preoriented component on to feed chute 500.

Feed chute 500 is shown in FIGS. 1 and 13 as being of the gravity feed variety, and as having an inlet 501 disposed adjacent supply escapement 402 and an outlet 502 disposed adjacent to component support 300. More specifically, feed chute 500 includes a curved channel 503 having integrally formed base portion 504, side portions 505, 506, a centrally disposed component supporting guide rib portion 507, and a pair of curved upper component guide plates 508, 509 which are affixed to the upper surfaces of side portions 505, 506, as by screws 510, 511, respectively. Chute 500 may be affixed to apparatus framework 2 by any suitable means, such as screws 512.

Side portion 505, and if desired side portion 506, is provided with openings 513 which are inclined in the direction of travel of a component downwardly through chute 500 and adapted to receive the ends of ducts, not shown, which are connected to a suitable source of pressurized air, also not shown. During the normal operation of the apparatus, air, directed through openings 513, is employed to assist the force of gravity in feeding components 10 through the chute and prevent component hang-up, due for instance to frictional engagement of a deformed component lead 12A with side portion 505 (see FIG. 13). It will be apparent from viewing FIG. 13, that during passage of components 10 through chute 500 the upper surface of rib portion 507 functions to slidably support the lower surface 15 of the components and that the side surfaces of the rib portion 507 function to maintain the components in pre-orientational position by engagement with component leads 12. Any resultant relatively outward bending of leads 12 will be subsequently corrected during insertion of the components, as discussed above. Guide plates 508 and 509 serve to prevent the air jets from blowing the components out of the feed chute.

Feed chute 500 is further provided with a component sensor, generally indicated as 514 in FIG. 1, which is disposed adjacent to chute outlet 502. Sensor 514 may be of any desired construction, but preferably is in the form of an air valve which is adapted to actuate a microswitch, not shown, associated with the control system of the apparatus for the purpose hereinafter discussed.

Feeder mechanism 600 is shown in FIG. 1 as including an arm member 601 which is pivotably supported on framework 2, as at 602, and adapted to be between a feed position shown in full line and a cocked position, illustrated in phantom as 601', by any suitable means as a fluid operated cylinder 603, which is actuated by the control system of the apparatus, not shown. Member 601 is provided adjacent the lower end thereof with a component pushing spring plate member or finger 604, suitably affixed thereto, as by rivets 605.

From viewing FIG. 1 it will apparent that when cylinder 603 is actuated to pivot arm 601 in the direction indicated by arrow 606 the free end of spring plate member 604 is adapted to engage the rearwardly facing surface portion 16 of component body portion 11 to force the component through the outlet end 502 of chute 500 onto support 300. Any suitable means such as an adjustable resilient bumper 607 may be provided to reduce vibration of member 601 when it is moved to the feed position shown and to adjustably control the extent of feed movement.

Referring to FIGS. 1 and 13, it will be seen that when member 601 is in its cocked position, spring plate 604' is deflected away from feed chute 500 by a pin 520, which is carried on framework 2 and disposed transversely of the chute, to permit unobserved passage of a component moving downwardly from supply 401 towards chute outlet end 502.

The presence of member 601 in its feed position may be sensed by a suitable microswitch generally shown as 608 for the purpose hereinafter discussed.

In explaining operation of the insertion apparatus of the present invention, it will be assumed that the initial or starting position of the apparatus is illustrated in FIGS. 1 and 2. In this position, the inserter 200 is shown in its upper position, feeder 600 is shown in feed position, and a component 10 is shown as being supported on support 300.

The initial step in the operational cycle of the apparatus includes simultaneous actuation of cylinder 603 and control rod 201, to pivot feeder arm member 601 into its cocked position as at 601', thereby removing spring plate 604 from beneath inserter 200 and unblocking chute 500 and actuate connecting linkage 5 to move control rod 201 downwardly within housing 101, so as to move inserter 200 into the position illustrated in FIGS. 3 and 4 and after engagement of head abutment 210 with housing abutment 114 to move tube member 202 downwardly with respect to head member 203 into its component insertion position, illustrated in FIGS. 5 and 6.

During movement of inserter 200 from the position illustrated in FIGS. 1 and 2 to that illustrated in FIGS. 3 and 4, support members 301 and 302 are pivoted from their component supporting position by cam plate 260 carried by head member 203; the abutment surface 314 provided on support member 301 thereafter being presented to block the outlet end 502 of chute 500 to prevent feeding of components therefrom. During movement of tube member 202 from the position illustrated in FIGS. 3 and 4 to that illustrated in FIGS. 5 and 6, pick up head 224 and thus component 10 are forced downwardly between spring plates 236, 237 to straighten and align the leads of the component and thereafter insert the leads into circuit board 25. After insertion of leads 12, pick up head bore opening 225 is vented to atmosphere, by means not shown, to release component 10 from pick up head 224 to permit the latter to be thereafter moved upwardly without disturbing the seating of the component leads. These leads may be simultaneously or subsequently processed as by suitable clinching mechanism to positively secure them to the board 25. Where clinching is effected while the pick up head 224 is in the down position the vacuum may be maintained therein, the clinched leads being sufficient to break the vacuum hold on the module.

Components of various thicknesses may be accommodated by the apparatus due to the provision of spring 228, which permits pick up head 224 to be forced upwardly into tube member 202 when the latter is in insertion position without excessive pressure being exerted on the component.

Immediately following the movement of support member 301 to effect blockage of chute outlet 502, escapement 401 of supply 400 is actuated to deposit a component in chute 500; the component normally moving downwardly through the chute into engagement with support member abutment 314 under the influence of gravity and the jets of pressurized air passing through openings 513. The presence of component 10 trips go-no-go sensor 514 thereby indicating to the control system of the apparatus that a component is available for the succeeding cycle of operation.

Subsequent to the positioning of a component adjacent to chute outlet 502, inserter 200 is returned to its initial position illustrated in FIG. 1. During upward movement of control rod 201, head member 203 and tube member 202 move together until the head abutment 210 engages housing abutment surface 115, whereupon ball 206 is forced from recess 205 to permit tube member 202 to slide upwardly with respect to head member 203 until ball 206 is again received in recess 204. Further, upward movement of the inserter permits spring 330 to return members 301 and 302 to their supporting position, thus unblocking of chute outlet 504.

After return of inserter 200 to its initial position, cylinder 603 is actuated to pivot feed member 601 into its feed position whereby a component 10 is positively forced out of chute 500 and onto support members 301 and 302, as illustrated in FIG. 1. During movement of the component along rib portion 310, inclined surfaces 321, 322 function to bend laterally outwardly any lead of the component which has previously been inwardly deformed.

Movement of member 601 into its feed position trips go-no-go sensor 608. When both of the go-no-go sensors 514 and 608 are tripped in the manner discussed above, the control system of the apparatus is conditioned for a subsequent operational cycle which immediately follows tripping of sensor 608. When either of sensors 514 or 608 are not tripped, operation of the apparatus is interrupted with the inserter in the up position illustrated in FIG. 1.

The electrical and pneumatic controls employed with the present apparatus form no part of the present invention and accordingly have not been discussed in detail. It will, however, be apparent to one skilled in the art that numerous well known controls may be employed, such as for instance controls of the general type disclosed in Patent 3,254,821 which may be readily modified in accordance with the teachings of the present disclosure.

Although the invention has been described in considerable detail, variation and modification can be effected within the spirit and scope of the invention as described hereinabove and as defined in the appended claims.

What is claimed is:

1. An apparatus for inserting into a board leads of electrical components characterized by a component body portion having a plurality of generally L-shaped leads, said leads being arranged in two rows extendng one row from each of a pair of opposed side surfaces of said body portion, the free ends of said leads of each said row projecting outwardly beyond one body portion surface joining said side surfaces, said leads when properly straightened and aligned being disposed in parallel rows, which comprises: a component inserter means; means adapted to reciprocate said inserter means between a first position and a component insertion position during each operational cycle thereof; support means adapted to position one component at a time in alignment with the path of reciprocation of said inserter means when in said first position, said inserter means being adapted to engage said one component and force the leads thereof into said board, said support means including a first surface position adapted to supportably engage said one surface of said component body and side surface portions adjoining said first surface portion, said side surface portions being adapted to relatively outwardly straighten said rows of leads with respect to said opposed side surfaces of said component body portion when said body portion is supportably engaged by said first surface portion; pusher means mounted for motion transversely of the path of reciprocation of said inserter means, said pusher means being operable prior to engagement of said component by said inserter means to push said component along said first surface portion to effect relatively outward straightening of said rows of leads by said side surface portions; and means operable subsequent to positioning of said one component to effect relatively inward straightening and aligning of said relatively outwardly straightened leads, said operable means including a pair of spaced members having component lead straightening and aligning slots disposed in facing surfaces thereof, said slots of each said member being disposed in a row and the spacing between slots of each row of slots corresponding to a desired spacing between said free ends of said leads in each said row of leads.

2. The apparatus according to claim 1, wherein said inserter means during reciprocation thereof towards said insertion position is adapted to engage said positioned component and thereafter move said engaged component with respect to said spaced members, whereby leads of said engaged component are forced to slide within said slots to effect relatively inward straightening and aligning thereof, said slots being tapered in the direction of reciprocation of said inserter means from said first to said insertion position.

3. The apparatus according to claim 2, wherein said inserter means includes a head member and a component engaging member, said spaced members are supported on said head member, and said head member is mounted for reciprocation with said engaging member to position said spaced members at a point immediately adjacent said board to ensure alignment of said leads of said engaged component when said leads are forced into said board, whereafter said engaging member is adapted to be moved relative to said head member to force the leads of said engaged component to slide within said slots to effect relative inward straightening and aligning thereof.

4. The apparatus according to claim 3, wherein said engaging member includes a vacuum head adapted to engage and pick up said positioned component, said spaced members are movable transversely of said path of reciprocation of said inserter means from a lead straightening and aligning position to an inoperative position, and means are provided to operably connected said engaging member and said spaced members, whereby said spaced members are moved into said inoperative position immediately after relatively inward straightening and aligning of said leads of said engaged component to permit unobstructed passage of said engaged component between said spaced members.

5. The apparatus of claim 1, wherein said support means includes a pair of pivotably supported members, said pivotable members having surface portions adapted to position one component at a time in alignment with the path of reciprocation of said inserter means, and means tending to maintain said pivotable members in component supporting position; and means are provided to operably connect said inserter means to said pivotable members whereby said pivotable members are moved from said supporting position during reciprocation of said inserter means from said first to said insertion position, at least one of said pivotable members defining said first and side surface portions.

6. The apparatus of claim 1, wherein said inserter means includes a head member and a component engaging member provided with a component pick-up means adjacent one end thereof, said spaced members are supported on said head member, and said component engaging member having said pick-up means is movable relative to said head member during a portion of the travel of said inserter means from said first to said insertion position, whereby the leads of components carried by said pick-up means are forced to move with respect to said lead straightening and aligning means.

7. The apparatus of claim 6, wherein said support means includes a pair of pivotally supported members, said pivotable members having surface portions adapted to position one component at a time in alignment with the path of reciprocation of said inserter means to permit said one component to be picked up therefrom by said pick-up means, said resilient means tending to maintain said pivotable members in component supporting position; and means are provided to operatively connect said head member to said pivotable members, whereby said pivotable members are removed from said supporting position against the bias of said resilient means during reciprocation of said inserter means to said insertion position.

8. The apparatus of claim 5, wherein said connecting means includes cam means mounted for reciprocation with said inserter means and a pair of cam followers connected one with each of said pivotable members, and said position maintaining means is a spring member having the ends thereof directly affixed one to each of said cam followers.

9. An apparatus for inserting into a board leads of electrical components characterized by a component body portion having a plurality of generally L-shaped leads, said leads being arranged in two rows extending one row from each of a pair of opposed side surfaces of said body portion, the free ends of said leads of each said row projecting outwardly beyond one body portion surface joining said side surfaces, said leads when properly straightened and aligned being disposed in parallel rows, which comprises: a component inserter means; means adapted to reciprocate said inserter means between a first position and a component insertion position during each operational cycle thereof; first and second pivotally supported members having co-acting surface portions adapted to position one component at a time in alignment with the path of reciprocation of said inserter means, said inserter means being adapted to engage said component and force said leads into said board; means adapted to feed components one at a time onto said co-acting surface portions of said pivotal members, said pivotal members being adapted to be pivoted from and return to said supporting position during reciprocation of said inserter means to and from said insertion position, said first pivotal member being disposed immediately adjacent to said feed means and including rib means adapted to guidingly support a component fed by said feed means onto said co-acting surface portions; and means operable subsequent to positioning of said one component onto said co-acting surface portions to effect straightening and aligning of said L-shaped leads.

10. The apparatus of claim 9, wherein said inserter means includes a component engaging member having a component pickup means; said straightening and aligning means includes spaced members having component lead straightening and aligning slots disposed in facing surfaces thereof, said slots of each said spaced member being disposed in a row and the spacing between slots of each row of slots corresponding to a desired spacing between said leads in each row of leads when properly straightening and aligned, and said pick-up means when said inserter means is reciprocated toward said insertion position being adapted to pick up said one component supported on said co-acting surface portions and thereafter move said picked up component with respect to said spaced members, whereby leads of said picked up component are forced to slide within said slots to effect straightening and aligning thereof.

11. The apparatus of claim 10, wherein said insertion means additionally includes a head member, said spaced members are supported on said head member, resilient means are provided to normally maintain said pivotal members in said supporting position, means are provided to operatively connected said head member to said pivotal members, and said head member is mounted for reciprocation with said engaging member to sequentially pivot said pivotal members from said supporting position against the bias of said resilient means after said one component is picked up from said co-acting surface portions by said pick-up means and to position said spaced members at a point immediately adjacent said board, whereafter said component engaging member is adapted to be moved relative to said head member to force the leads of said picked up component to slide within said slots to effect straightening and aligning thereof.

12. The apparatus of claim 11, wherein said connecting means includes a cam plate carried by said head member and a pair of cam plate follower means associated one with each of said pivotal members, and said resilient means includes spring means having the respective ends thereof directly affixed to said follower means.

13. The apparatus of claim 9, wherein said first member includes abutment means adapted to prevent feeding of component onto said co-acting surface portions by said feed means, when said members are pivoted from said supporting position.

14. The apparatus of claim 9, wherein said rib means is provided with an upper surface portion adapted to slidably support said joining body surface of said component body portion and inclined side surface portions adapted to maintain a predetermined spacing between said leads extending from said opposed side surfaces of said component body portion.

15. In an apparatus for inserting the leads of electrical components into a board having a component insertion assembly including inserter means and means adapted to support said components one at a time in position to permit a component to be picked up therefrom by said inserter means during each operational cycle thereof, the provision of a component feeding assembly disposed adjacent said insertion assembly which comprises: a component supply having escapement means; a chute having an inlet end disposed adjacent said supply and an outlet end disposed adjacent said component support means; and feeder means adapted to feed components one at a time from said chute on to said component support means, said escapement and said feeder means being adapted to be actuated sequentially once during each said operational cycle to permit one component at a time to be discharged from supply into said chute and be thereafter fed from said chute on to said support means.

16. The apparatus of claim 15, wherein component sensing means are provided adjacent to said outlet end of said chute, said sensing means being adapted to interrupt operation of said inserter means in the absence of a component from said chute during a predetermined portion of said operational cycle.

17. The apparatus of claim 15, wherein said feeder means is movable between cocked and feed positions during each said operational cycle and there is provided feeder sensing means, said sensing means being adapted to interrupt operation of said inserted means when said feeder means is not in said feeder position during a predetermined portion of said operational cycle.

18. The apparatus of claim 15, wherein said components tend to pass from said supply through said chute under the force of gravity, said feeder means includes a pivotably supported resilient feeder member adapted to be moved along said chute between cocked and feed positions during each said operational cycle, and means are provided to deflect said member when in cocked position from a point adjacent said chute to permit passage of a component from said supply along said chute.

19. The apparatus of claim 18, wherein a plurality of air jets are disposed along said chute, said jets tending to force components discharged onto said chute towards said outlet.

References Cited

UNITED STATES PATENTS

| | | | |
|---|---|---|---|
| 2,850,737 | 9/1958 | Walsh | 227—116 |
| 2,869,130 | 1/1959 | Newton et al. | 227—116 |
| 2,896,208 | 7/1959 | Alderman et al. | 227—118 |
| 3,007,172 | 11/1961 | Hazel | 227—119 X |
| 3,081,885 | 3/1963 | Carlzen et al. | 227—119 X |
| 3,254,821 | 6/1966 | Ackerman et al. | 227—119 |

GRANVILLE Y. CUSTER, Jr., *Primary Examiner.*

U.S. Cl. X.R.

227—90, 116, 119

PO-1050
(5/69)

UNITED STATES PATENT OFFICE

CERTIFICATE OF CORRECTION

Patent No. 3,442,430 Dated June 4, 1969

Inventor(s) Daniel W. Ackerman and Robert H. Holmes

It is certified that error appears in the above-identified patent and that said Letters Patent are hereby corrected as shown below:

In the claims, Claim 1 col. 10, line 3, the word "position" should read -- portion --.

SIGNED AND
SEALED
MAR 17 1970

(SEAL)
Attest:

Edward M. Fletcher, Jr.
Attesting Officer

WILLIAM E. SCHUYLER, JR.
Commissioner of Patents